Dec. 10, 1968 A. MEYERHOFF 3,415,943

STUD TYPE BASE DESIGN FOR HIGH POWER SEMICONDUCTORS

Filed Aug. 2, 1966

WITNESSES

Edwin E. Bassler

James F. Young

INVENTOR

Alfred Meyerhoff

BY

C. L. Menzemer

ATTORNEY

United States Patent Office 3,415,943
Patented Dec. 10, 1968

3,415,943

STUD TYPE BASE DESIGN FOR HIGH POWER SEMICONDUCTORS

Alfred Meyerhoff, Greensburg, Pa., assignor to Westinghouse Electric Corporation, Pittsburgh, Pa., a corporation of Pennsylvania Filed Aug. 2, 1966, Ser. No. 569,723
3 Claims. (Cl. 174—52)

ABSTRACT OF THE DISCLOSURE

This invention relates to a bimetallic stud-type base to which a semiconductor device can be joined. The base has a flat portion of a first-metal to which the device is joined and a stud portion of a second metal. The stud portion is integrally joined to the base portion.

The present invention relates to a new and novel stud-type base design for high power semiconductors.

One of the continuing problems in the application and manufacture of semiconductor devices is the dissipation of heat from the device and particularly from the body of semiconductor material to a suitable heat sink.

Generally, the body of semiconductor material has been joined, either by soldering or compressive force means, to a molybdenum, tungsten or tantalium plate, which in turn is joined to a copper base. The copper base is a part of the case which encloses the device and shields it from the ambient.

Copper is used for the case base because of its excellent electrical and thermal conducting properties.

Figure 1:
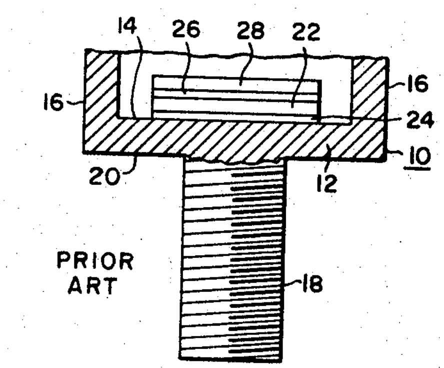

FIGURE 1 shows a typical prior art copper case base 10. The base 10 has a flat portion 12 which has a flat top surface 14 and side walls 16. The side walls are illustrated as being incomplete inasmuch as, depending on design preference, the copper walls may continue up the side of the case or may be joined to a ceramic or other electrically insulating material.

A threaded stud portion 18 extends from bottom surface 20 of the base 10.

Typically a molybdenum plate 22 is joined to surface 14 of the base 10 by a solder layer 24 and a wafer 28 of a semiconductor material, which contains one or more p-n junctions, is joined t othe molbdenum plate 22 by a solder layer 26.

Figure 2:
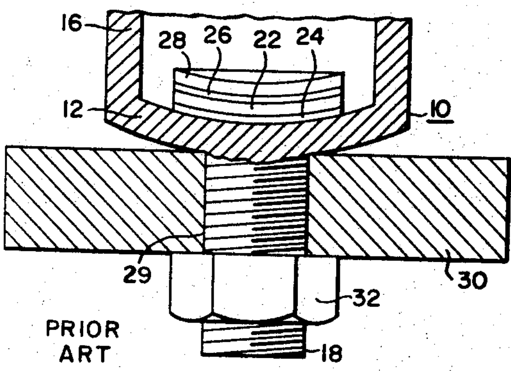

With reference to FIG. 2, generally in using the device of FIG. 1 in machinery, the stud portion 18 of base 10 is inserted in an opening 29 in a heat sink member 30 and tightened down and the base 10 is held in intimate contact with the heat sink 30 by a nut 32.

Unfortunately, the mechanical properties of copper which comprises the base 10, such as yield, tensile and shear strength are poor when compared with the materials used as heat sinks for example steel. As a result of the poor mechanical properties, the copper base 10 frequently undergoes mechanical deformation when subjected to the necessary clamping force required to assure intimate contact with the heat sink 30.

Figure 3:
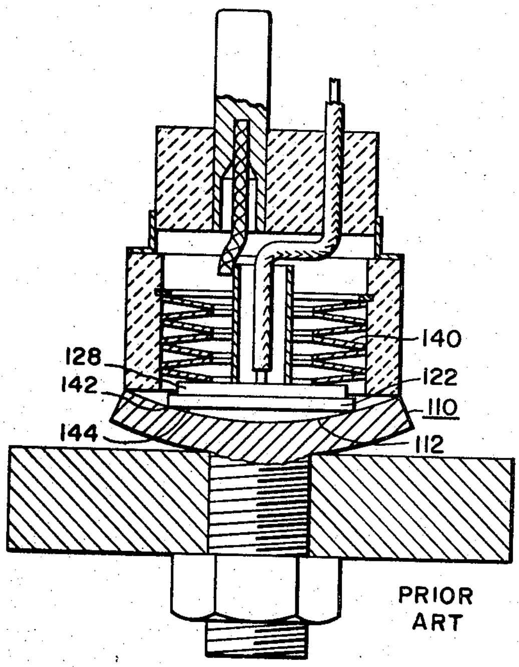

In devices such as that shown in FIGS. 1 and 2, wherein the wafer 28 and molybdenum plate 22 are joined to each other and to the base 10 with solder the deformation is not always critical unless the wafer 28 is cracked by the deformation. However, in a device such as is shown in FIG. 3 wherein the wafer 128 is held in electrical and thermal contact with the molybdenum plate 122 and the plate 122 is held in electrical and thermal contact with the flat portion 112 of the base 110 by compressive means 140 such as a spring, the problem of deformation is always critical. Details of a pressure contact device of the type shown in FIG. 3 can be found in U.S. Patent 3,337,-781.

The increased criticality results from the fact that, due to an absence of a solder layer between the molybdenum plate 122 and the base 110, after deformation, contact between the plate 122 and surface 112 is reduced to only a small point 142 around the perimeter of the bottom surface 144 of the molybdenum plate 122.

Some attempt has been made to solve this problem by using a copper alloy for the base. However, these alloys do not have adequate thermal and electrical conductivity to make their use practical.

An object of the present invention is to provide a bimetallic case for a semiconductor which will not deform when secured to a heat sink.

Other objects will, in part, be obvious and will, in part, appear hereinafter.

Figure 4:
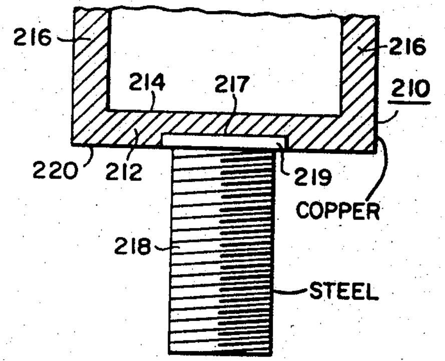
Figure 5:
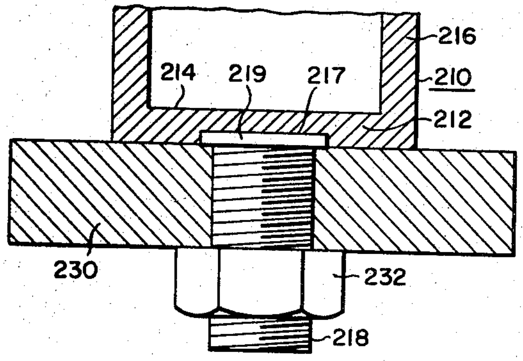

For a better understanding of the nature and objects of the invention, reference should be had to the following detailed description and drawings, in which:

FIGURES 1 to 3 inclusive are side views, partially in section of prior art devices;

FIG. 4 is a side view, partly in section of a case prepared in accordance with the teachings of this invention; and FIG. 5 is a side view, partially in section of the device of FIG. 4 connected to a heat sink.

In accordance with the present invention there is provided a stud-type base to which a semiconductor device can be affixed comprising (1) a flat portion, said flat portion having a top and a bottom surface, said top surface adapted to have a semiconductor element joined thereto in an electrical and thermal relationship, (2) a stud portion, said stud portion being integrally joined to the bottom surface of said flat portion and extending therefrom, said stud portion being of a material having a higher yield strength, shear strength and tensile strength than said flat portion.

More specifically, and with reference to FIG. 4, there is shown a stud-type base 210 in accordance with the teachings of this invention.

The stud-type base 210 has a flat portion 212. The flat portion 212 has a top surface 214 and a bottom portion 220. Side walls 216 may be affixed integrally or by soldering or brazing to the flat portion 212.

The flat portion 212 of the base 210 consists of a metal having a good thermal and electrical conductivity as for example copper, aluminum and silver.

The bottom surface 220 of flat portion 212 has a centrally disposed cavity 217 therein. One end 219 of a stud portion 218 is disposed within the cavity 217 and joined to the flat portion 212 by brazing, welding or the like. The stud portion 218 is threaded to facilitate the connecting of the case to a bus bar or heat sink.

The stud portion is comprised of a material having a higher yield strength, shear strength and tensile strength than the flat portion 212. Exceptionally good results have been realized when the stud portion is comprised of steel.

With reference to FIG. 5, when the steel stud portion 218 of the base 210 is inserted through an aperture in a heat sink 230 and the base 210 held in a heat conducting relationship with the heat sink by a nut 232, the load resulting from tightening the nut 232 on the stud 218, is carried by the end 219 of the stud as well as the flat portion 212 of base 210. As a result, any deformation of the copper base is limited to the degree that the end 219 of the steel stud is deformed. Any deformation that may result is entirely negligible and does not adversely affect any electrical contacts or wafer of semiconductor material in contact with the upper surface 214 of the flat portion 212 of the base 210.

Since certain changes in the product embodying the invention may be made without departing from its scope, it is intended that the accompanying description and drawing be interpreted as illustrative and not limiting.

I claim as my invention:

1. A bimetallic study-type base to which a semiconductor element can be joined in an electrical and thermal relationship comprising (1) a flat portion of a first metal, said flat portion having a top and a bottom surface, said top surface adapted to have a semiconductor element joined thereto in an electrical and thermal relationship, said bottom surface having a cavity centrally disposed therein, (2) a threaded stud portion of a second metal, said stud portion being disposed within said cavity and integrally joined to the bottom surface of said flat portion and extending therefrom, said stud portion being of a material having a higher yield strength, shear strength and tensile strength than said flat portion.

2. The stud-type base of claim 1 in which the stud portion is steel.

3. The stud-type base of claim 1 in which the flat portion consists of metal selected from the group consisting of copper and silver and the stud portion is of steel.

References Cited

UNITED STATES PATENTS

| | | | |
|---|---|---|---|
| 3,015,760 | 1/1962 | Weil | 174—52 |
| 3,020,454 | 2/1962 | Dixon | 174—50.5 |

LEWIS H. MYERS, *Primary Examiner.*

D. A. TONE, *Assistant Examiner.*

U.S. Cl. X.R.

317—234